US 6,661,718 B2

(12) United States Patent
Ohlhoff et al.

(10) Patent No.: US 6,661,718 B2
(45) Date of Patent: Dec. 9, 2003

(54) TESTING DEVICE FOR TESTING A MEMORY

(75) Inventors: Carsten Ohlhoff, München (DE); Peter Pöchmüller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/035,866

(22) Filed: Dec. 31, 2001

(65) Prior Publication Data

US 2002/0149975 A1 Oct. 17, 2002

Related U.S. Application Data

(63) Continuation of application No. PCT/DE00/02100, filed on Jun. 28, 2000.

(30) Foreign Application Priority Data

Jun. 30, 1999 (DE) .......................................... 199 30 169

(51) Int. Cl.$^7$ ................................................ G01R 31/28
(52) U.S. Cl. ........................ 365/201; 714/724; 365/200; 324/73.1
(58) Field of Search ................................ 365/200, 201

(56) References Cited

U.S. PATENT DOCUMENTS

| | | | | | |
|---|---|---|---|---|---|
| 4,961,053 | A | * | 10/1990 | Krug | ..................... 324/158 R |
| 5,355,369 | A | | 10/1994 | Greenberger et al. | |
| 5,506,499 | A | * | 4/1996 | Puar | ........................ 324/158.1 |
| 5,659,551 | A | | 8/1997 | Huott et al. | |
| 5,742,614 | A | | 4/1998 | Cline | |
| 6,357,022 | B1 | * | 3/2002 | Nguyen et al. | ............... 714/42 |
| 2001/0026486 | A1 | * | 10/2001 | Ogawa et al. | .............. 365/201 |
| 2002/0199142 | A1 | * | 12/2002 | Gefen | ........................ 714/724 |

FOREIGN PATENT DOCUMENTS

| | | | | |
|---|---|---|---|---|
| DE | 40 18 438 C2 | 1/1991 | | |
| DE | 197 52 443 A1 | 6/1998 | | |
| DE | 198 23 931 A1 | 12/1998 | | |
| DE | 197 25 581 C2 | 1/1999 | | |
| DE | 198 08 337 A1 | 2/1999 | | |
| DE | 198 19 570 A1 | 11/1999 | | |
| JP | 358053093 A | * | 3/1983 | ........... G11C/29/00 |
| JP | 359050372 A | * | 3/1984 | ........... G01R/31/00 |

* cited by examiner

*Primary Examiner*—Viet Q. Nguyen
(74) *Attorney, Agent, or Firm*—Laurence A. Greenberg; Werner H. Stemer; Ralph E. Locher

(57) ABSTRACT

A substrate includes a memory and a testing device for testing the memory. The testing device includes an interpreter element that operates and tests the memory in accordance with a test program. The test program command codes are stored in the untested memory cell array of the memory that will be tested. The advantage of the testing device consists, inter alia, in the fact that the testing device no longer needs to be adapted to changed hardware properties of the chip generation or fabrication lines because the test program, which is suitable for the respective chip type, is stored as a variable code on the respective memory which is to be tested. It is thus also possible to test various memory chip types with the same testing device.

20 Claims, 2 Drawing Sheets

TESTING DEVICE FOR TESTING A MEMORY

CROSS-REFERENCE TO RELATED APPLICATION

This application is a continuation of copending International Application No. PCT/DE00/02100, filed Jun. 28, 2000, which designated the United States.

BACKGROUND OF THE INVENTION

Field of the Invention

The invention relates to a testing device for testing a memory, in particular a random access semiconductor memory having a multiplicity of memory cells associated with bit lines that can be connected to input/output lines leading out of the memory by a drive circuit. The testing device tests the memory by performing a plurality of individual tests in accordance with a test program. The invention also relates to a method for testing a memory and to a circuit arrangement having a multiplicity of circuits that will be tested, that are formed on a common substrate, and that are separated in a following fabrication step.

As memory cell arrays in semiconductor memories become larger and larger with generation changes taking place at increasing speed, memory capacity is expected to approximately quadruple very three years (for example from the 64 Mbit DRAM generation to the 256 Mbit DRAM generation). It is essential to test memory cells in semiconductor memories because under certain circumstances a single defective memory cell can lead to the total failure of the entire semiconductor memory. For this reason, in most semiconductor memories, redundant memory cells are provided which are addressed instead of the defective memory cells. However, it is necessary to test the operational capability of the entire memory, i.e. of each semiconductor memory cell, to be able to replace the memory cells that are identified as faulty with redundant memory cells if appropriate. Hitherto, testers were used, which make contact with the semiconductor chips while they are still in the composite wafer by placing small needles on the contact areas. There are also testers that make contact with the semiconductor chips when they are already housed or wired. After the tester makes contact with the semiconductor chips, all the memory cells of the memory cell array are tested. The addresses of the defective memory cells are stored externally (that is to say in the tester) and are used for redundancy evaluation after testing the operational capability. In this evaluation, redundant memory cells are assigned to the addresses of the defective memory cells.

Given the currently achieved sizes of memory cell arrays with storage capacities of 256 Mbit or 1 Gbit, testing the memory cells entails considerable costs that are proportional to the size of the memory and are thus related exponentially to the generation of the memory chip. The testing procedure requires greater time for each semiconductor memory produced. For the imminent 1 Gbit generation, it is estimated that the testing costs make up 30% of the entire production costs.

Because the hardware of the expensive testers has to be adapted with each new generation, which again signifies significant expenditure, attempts are being made to reduce the necessary tests to a minimum. Carrying out the tests on several chips simultaneously cannot be expanded any more using the customary testing of up to 64 memories because this approach is limited by the number of contact needles of the tester that can be placed on the chip. Even with a conceivable reduction of the contact needles that are required for the test and that are to be placed on the chip, the entire memory cell array would have to be tested by the tester on a cell-by-cell basis.

The data that has been acquired by the test, relating to the position and/or addresses of the defective memory cells, is evaluated after the test by the hardware and the software of the tester or by a further external device. Here, a redundancy analysis is carried out which assigns redundant memory cells to the addresses of the defective memory cells. This assignment data is subsequently buffered or fed directly to an element that "wires" the assignment onto the chip. This can be done using a laser beam that burns away tracks, using fuses or anti-fuses, or using other suitable means.

The test program is generally contained in the external tester in the form of a fixed circuit or is produced by means of programmable units at great cost. Changing the test program or the devices that carry out the test leads to very cost-intensive delays in mass production, which often entails a loss of time that can not be made up.

SUMMARY OF THE INVENTION

It is accordingly an object of the invention to provide a testing device, a circuit configuration including a plurality of circuits that will be tested, and a method for testing a memory which overcome the above-mentioned disadvantages of the prior art apparatus and methods of this general type.

In particular, it is an object of the invention to provide a testing device that can be used universally, i.e. that does not require any structural changes when used with various memory sizes (that is to say is independent of the size of the memory arrays to be tested) or memory types. It is an object to enable the testing device to be quickly adapted to a changing test program without having to perform structural interventions. It is also an object of the invention to reduce the test duration.

With the foregoing and other objects in view there is provided, in accordance with the invention, a testing device in combination with a substrate having a memory that will be tested. The memory includes a plurality of memory cells and the memory stores a test program. The memory is formed either in the substrate or on the substrate. The testing device includes an interpreter element that operates and tests the memory in accordance with the test program that is stored in the memory.

A testing device that operates in accordance with a test program is provided. The test program command codes of the testing device are stored in the untested memory cell array of the memory chip that will be tested. The advantage of the testing device consists, inter alia, in the fact that the testing device per se no longer needs to be adapted to changed hardware properties of the chip generation or fabrication lines because the test program which is suitable for the respective chip type is stored as a variable code on the respective memory that will be tested. It is thus also possible to test various memory chip types with the same testing device. Rapid adaptation of the test programs for the memory chips is also possible without necessitating intervention in the testing device. It is thus no longer necessary to perform time-consuming changing of the testers and/or of the programs that control the testers or to store the programs again in the case of different memory types. Additionally, it is no longer necessary to change the circuits of the memory chips. The exponential growth in the testing time using the expensive testers and the associated costs are prevented. As a result of the new approach of the individually programmable and cost-effective testing device, all of the tests that relate to the memory cell array can also be carried out in a more detailed way. This constitutes a significant improvement in that the faulty chips or their fault sources can be analyzed more precisely. The testing device can be used flexibly and can be quickly adapted to a new test program without having to make structural changes to the circuits of the memory; this enables the overall time that is necessary for the testing to be reduced.

In accordance with an added feature of the invention, the testing device is formed on or in the substrate. As a result, the formation of external contacts using contact needles that would be placed on the substrate of the memory is advantageously no longer necessary. This minimizes the use of external equipment, or makes it superfluous, and testing while already in the composite wafer is made possible.

In accordance with an additional feature of the invention, a plurality of identical or independent memories are formed in the substrate. These memories will be separated after the test is concluded, and if appropriate, after action in accordance with the results of these tests have been taken. The advantage is that the wafer on or in which the individual memory chips are formed is significantly easier to handle than a multiplicity of individual memory chips, and that parallel testing of all of the chips fabricated on the wafer is simultaneously possible.

In accordance with another feature of the invention, each individual memory has a separate testing device that is formed on or in the substrate. As a result, even different types of memories can be formed on a single wafer and/or different test programs can be used for the individual memories.

In accordance with a further feature of the invention, all of the memories are associated with a single common testing device. This minimizes the necessary chip area and the substrate area on the individual memory chips is not wasted on the testing device, which is required only once.

In accordance with a further added feature of the invention, the interpreter element has a control part which, in accordance with respective individual test instructions of the test program, writes a specific test data pattern to one or more memory cells of the memory cell array of the memory undergoing testing. The interpreter element makes this test data pattern available as the expected data. After this, in a further advantageous embodiment of the invention, a comparator device is provided which compares the data read out of the memory cells of the tested memory with the expected data which is made available. The interpreter element supplies a result in the event of an inequality. Consequently, effective and simple functional testing of the individual memory cells is achieved.

In accordance with a further additional feature of the invention, a test instruction reading device reads the individual test instructions of the test program out from the tested memory cell array and makes the individual test instruction available to the control part. As a result, the control part can operate independently of the need to extract individual test instructions from the tested memory cell array.

After this, one or more registers are advantageously provided, which buffer the individual test instructions. The individual test instructions are fetched in succession from the registers by the control part. This provides an advantage in that the control part can operate independently from the speed of the test instruction reading device and from the speed that the individual test instructions are processed.

In accordance with yet an added feature of the invention, a writing device is provided which writes the results of the comparator device into a results memory. After this, one or more registers are advantageously provided which buffer the individual results. The results are read out from the registers by the writing device. The advantage achieved in this way is that the writing device can operate independently from the speeds of the comparator device and the storage of the results.

In accordance with yet an additional feature of the invention, the results memory is embodied as an external test memory or as a test memory formed on the substrate. In this way, the results can be stored and evaluated at a later time for a redundancy analysis.

In accordance with yet another feature of the invention, the results memory is formed by the memory cells of the tested memory. In this way, the space that would be required by an additional test memory and/or by contacting means for transferring the results into an external memory on the substrate becomes free. After this, the writing device is advantageously embodied such that writing the results of the comparator device into the memory cells of the tested memory takes place in a redundant fashion, that is to say in a way which is tolerant of faulty memory cells.

With the foregoing and other objects in view there is provided, in accordance with the invention, a circuit configuration that includes a substrate having a plurality of circuits formed thereon. The substrate has intermediate spaces formed between the plurality of the circuits and separating the plurality of the circuits. The substrate has feedlines formed in the intermediate spaces and connected to the plurality of the circuits. Each one of the plurality of the circuits stores a test program. The circuit configuration also includes a testing device connected to at least one of the feedlines. The testing device includes an interpreter element that operates and tests at least one of the plurality of the circuits in accordance with the test program that is stored in that one of the plurality of the circuits.

In other words, the circuit arrangement has a plurality of circuits, in particular memories, formed on a common substrate. The circuits have an intermediate space between them in order to permit them to be separated. Feedlines which connect the individual circuits to one another and/or to one or more additional circuits are formed in the intermediate spaces. As a result, electrical contact between the circuits, which are still located in the semiconductor assembly on the common substrate, is made possible such that the required line routes do not take up space on the substrate which can be used for the circuits. The feedlines are formed in the region of the substrate which is lost when the circuits are separated, and therefore cannot be used for the circuits.

In accordance with an added feature of the invention, the substrate has an edge region; and the testing device is formed either in the intermediate spaces or the edge region.

In accordance with an additional feature of the invention, there is provided, a test memory for recording test data acquired by the testing device; and a program memory for storing instructions of a program used by the testing device. The test memory is connected by the feedlines to either the testing device or least one of the plurality of the circuits. The program memory is connected by the feedlines to either the testing device or at least one of the plurality of the circuits.

In accordance with another feature of the invention, the test memory is formed either in one of the intermediate spaces or the edge region. The program memory is formed either in one of the intermediate spaces or in the edge region.

In accordance with a further feature of the invention, the substrate includes contact areas for electrically contacting the plurality of the circuits. The contact areas are formed either in one of the intermediate spaces or in the edge region.

With the foregoing and other objects in view there is provided, in accordance with the invention, a method for testing a memory. The method includes steps of: forming a program memory from memory cells of a memory that will be tested; reading at least one individual test instruction out of the program memory; using a control part to interpret the test instruction; writing a test data pattern, defined by at least one individual test instruction, to memory cells of a memory cell array that will be tested; reading memory states of the memory cells of the memory cell array to which the test data pattern had been written; comparing the memory states with expected data that is predefined by the test data pattern; if the memory states are not equal to the expected data, then storing addresses of the memory cells of the memory cell array into a results memory; and reading at least one additional individual test instruction from the program memory.

The program memory and/or the results memory are preferably embodied by the memory cells of the tested memory.

In accordance with an added mode of the invention, a plurality of memories are tested when they still are located in the substrate assembly (wafer assembly). As a result, the memories are tested particularly effectively and cost-effectively because the testing takes place before the individual memories are separated.

In accordance with an additional mode of the invention, the test program containing the individual test instructions is stored in the memory/memories that will be tested before the beginning of the test.

In accordance with a concomitant mode of the invention, the addresses of the faulty memory cells are stored redundantly and/or the individual test instructions are read out redundantly. This makes it possible to store, and to subsequently read out, the test program and/or the results such that faulty memory cells of the tested memory can be tolerated. These results are in the form of addresses of the faulty memory cells.

Other features which are considered as characteristic for the invention are set forth in the appended claims.

Although the invention is illustrated and described herein as embodied in a testing device for testing a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
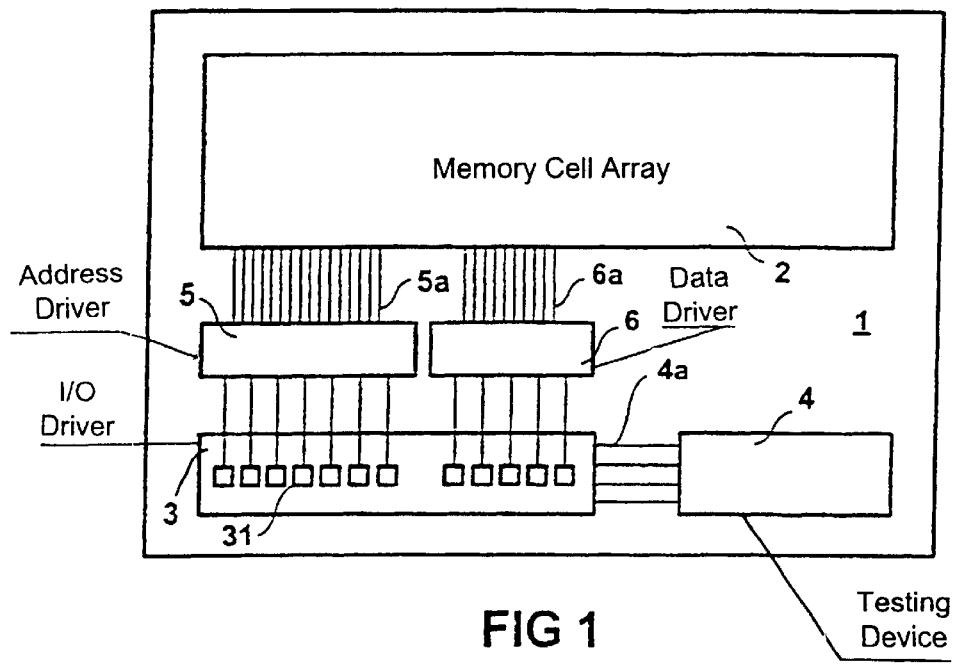
FIG. 1 is a schematic view of a testing device that is formed on a substrate together with a memory.

Referring now to the figures of the drawing in detail and first, particularly, to FIG. 1 thereof, there is shown a substrate 1. A memory is formed on or in the substrate 1. The memory has a multiplicity of memory cells formed in a memory cell array 2. The memory cells are connected by address bit lines 5a to an address driver circuit 5 and by data bit lines 6a to a data driver circuit 6. Contact faces 31 and an input/output driver circuit 3 enable external contact to be made to the memory. Furthermore, an inventive testing device 4 is formed on or in the substrate 1 and is connected to the input/output driver circuit 3 via lines 4a. The testing device 4 operates the memory in the same way as in the normal operating mode by executing write and read operations to perform different test steps in accordance with a test program. It is also possible to connect the testing device 4 to the address driver circuit 5 and to the data driver circuit 6, or to connect it directly to the address bit lines 5a and the data bit lines 6a. When the testing device 4 is connected to the input/output driver circuit 3, as shown in the exemplary embodiment, the address driver circuit 5 and the data driver circuit 6 are advantageously also tested in the test of the memory.

The testing device 4 writes data $WD_{1-N}$ into memory cells of the memory cell array 2 and then reads data $RD_{1-N}$ out from the memory cells of the memory cell array 2. By comparing the read out data $RD_{1-N}$ with the written in data $WD_{1-N}$, it is possible to classify the memory cells as either defective or operational.

The addresses $ADR_{1-M}$ associated with the defective memory cells can be stored for further evaluation. The addresses of the defective memory cells that have been acquired by the test are made available for a subsequent redundancy analysis using this data. As a result, lengthy test runs in highly-complicated testers, which are expensive to operate, are avoided because the address list of the defective memory chips is transferred directly to the devices that assign the redundant memory cells.

In the process, the addresses of the defective memory cells can be stored in a test data memory that can be formed by an external memory with non-volatile or volatile memory cells. It is also possible to store the addresses in the actual memory that is tested. As a result, no additional memory is required.

Figure 2:
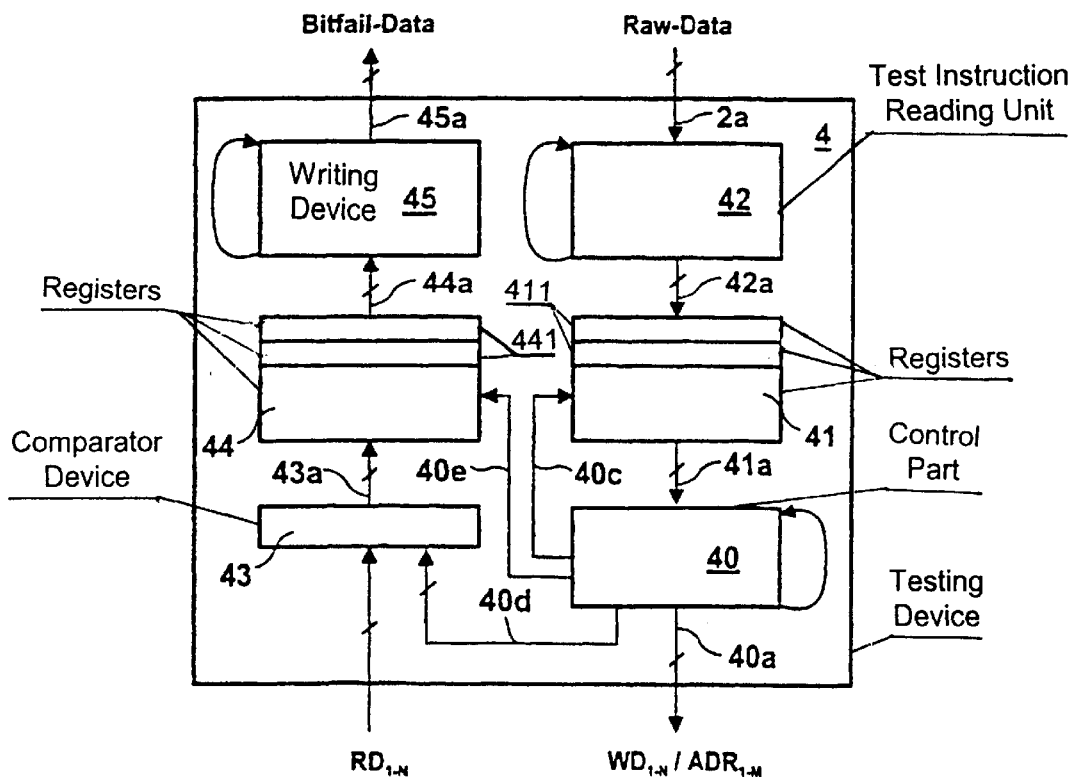
FIG. 2 is a schematic view of the testing device.

The inventive testing device 4 is explained in more detail in FIG. 2. The testing device 4 includes a test instruction reading unit 42, registers 41 and 441 that are associated with the test instruction reading unit 42 to buffer the individual instructions of the test program, a control part 40 for writing to the memory cells, a comparator device 43 for comparing the expected data 40d with the data $RD_{1-N}$ read out from the tested memory cell array 2, and results registers 44 and 441 that are associated with the comparator device. The results registers 44 and 441 buffer the results of the comparator device 43 and the addresses 40e of the defective memory cells. The testing device 4 also includes a writing device 45 for storing 45a the data 44a, which has been buffered in the registers 44 and 441, in a results memory. The control part 40 writes to the memory cells of the memory cell array in accordance with a pattern that has been predefined by the test program and also makes these test data patterns available to the comparator circuit 43. The patterns correspond to the expected storage states 40d of the memory cells. The comparator circuit 43 compares the data $RD_{1-N}$ read out from the tested memory cells with the expected storage states 40d, and in the event of an inequality, supplies a result which corresponds to the address $ADR_{1-M}$ of the memory cell that does not have the correct storage state. Alternatively, the comparator circuit 43 controls the storage of the address $ADR_{1-M}$ in one of the registers 44 and 441. In the process, it is possible to access the bit lines of the memory cell array directly or to address the input/output device 3 while the memory cells are being written to and while the comparator device 43 is reading the memory cells. The address and data drivers 5 and 6, respectively, are included in the test when the input/output device 3 is addressed.

The test program, which is composed of a large number of individual steps and in accordance with which the control part 40 operates, is not stored in the form of hardware encoded circuits, but rather is stored in a memory in a freely programmable fashion. It is possible to provide a separate program data memory to store the test program or to store the test program in the tested memory. The individual steps are read out of the memory by the testing device 4. When the untested memory cells are used for storing the program data, the individual steps are stored redundantly, which permits the individual program steps to be read out reliably even when there are individual defective memory cells.

For this purpose, the test instruction reading unit 42 is embodied such that it automatically reads out the individual instructions redundantly from the tested memory cell array and stores the individual instructions in registers 41 and 441 in succession. The test instructions are individually transferred from the registers 41 and 411 to the control part 40 and/or are requested by the control part 40 with a signal 40c. Likewise, the results of the comparator unit 43 can be stored redundantly in the memory cell array 2 in the form of the addresses $ADR_{1-M}$ of the defective memory cells. The addresses of the defective memory cells are first stored in registers 41 and 441 and are then written redundantly into the memory cell tested array using a writing device 45 that operates automatically. If the data is not stored in the tested memory, it can be stored in an external memory or in a separate test data memory.

Figure 3:
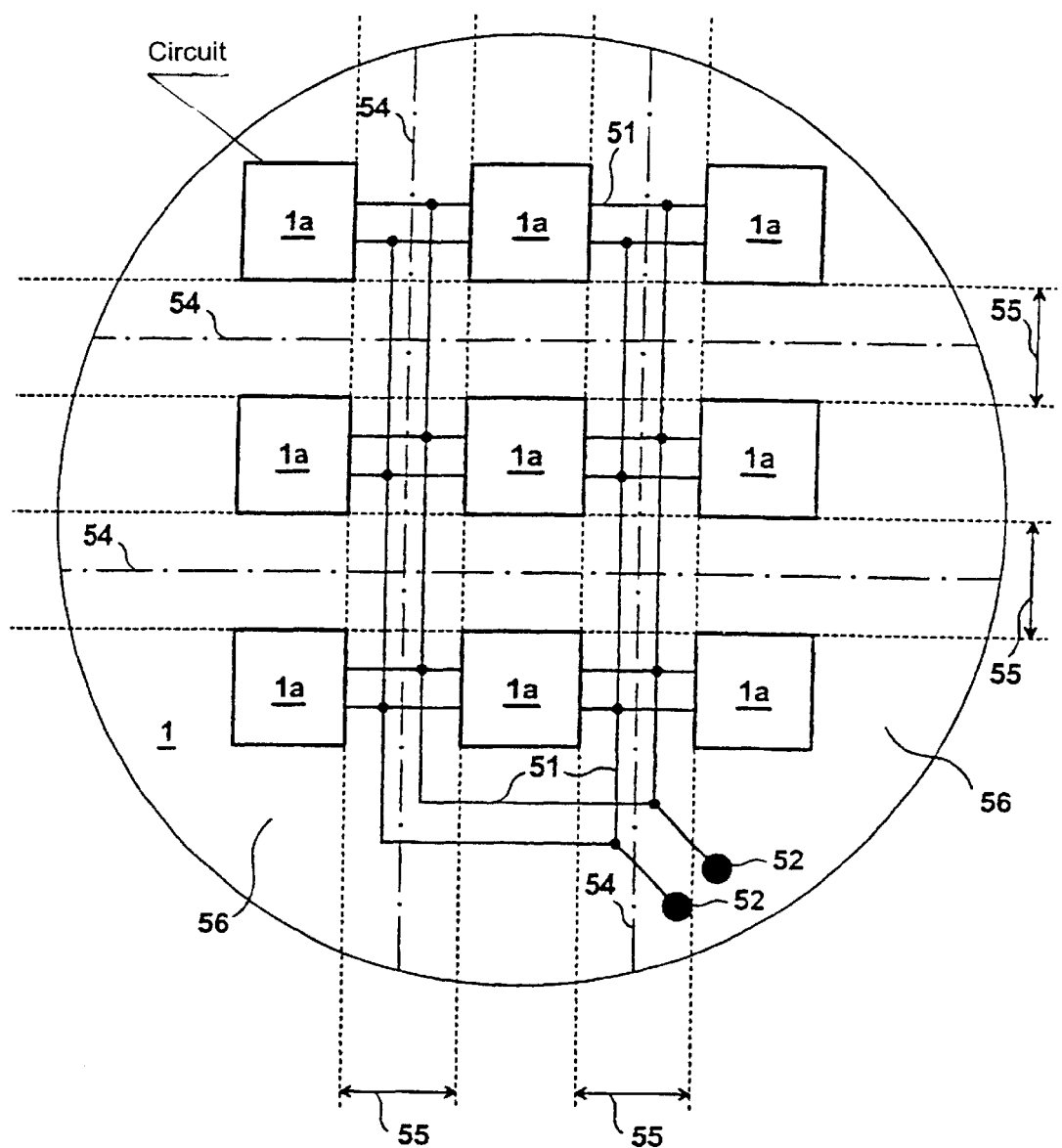
FIG. 3 is a view of a wafer with a plurality of circuits that are connected to one another by lines and that will be subsequently separated from each other.

FIG. 3 shows an inventive circuit arrangement including a plurality of circuits 1a, preferably memories, which are formed in or on a common substrate 1. The circuits 1a are connected to one another by feedlines 51 that are formed between the circuits 1a in or on the substrate 1. The intermediate spaces 55 between the circuits 1a on the substrate 1 that are occupied by the feedlines 51 are not necessarily occupied by the circuits 1a so that the intermediate spaces 55 allow separation of the individual circuits 1a along cutting edges 54. The feedlines 51 are destroyed by the subsequent separation (division of the substrate 1, common to the circuits 1a, along the cutting edges 54) and are no longer required. In order contact the circuits 1a through the feedlines 51, contact areas 52 are provided in an intermediate space 55 or at the edge region 56 of the substrate 1.

In this way, the circuits 1a formed as memories can also be supplied with power in the wafer assembly. As a result of supplying the wafer with an operating voltage, the memories can be tested using a plurality of testing devices that operate according to a test program. One of the testing devices is embodied for each individual memory. Alternatively, the memories can be tested with a single testing device that is common to all of the memories. It is no longer necessary to make contact with the individual memories using a tester. The test program according to which the testing device operates is stored in one or more of the memories that will be tested or in a program memory specially provided for this purpose.

The circuits, the testing device, or the testing devices can be connected to various system clocks by the feedlines 51. These clocks may be necessary when testing memory modules to perform functional checking for synchronization, in particular, of the input/output interfaces.

The data acquired by the test can be stored a test memory that is formed by one of the additional circuits on or in the substrate 1. The test memory is connected by the feedlines 51 to one or more circuits that will be tested and/or to the testing device, which can also be formed by one of the additional circuits. The test memory, which may be formed by a volatile or a non-volatile memory that is supplied with a voltage, and/or the testing device can also be embodied in an intermediate space 55 or at the edge region 56 of the substrate 1 that includes the individual circuits 1a.

The data acquired by the test can be evaluated, for example, in the form of a redundancy analysis, either by the testing device itself or by an external device. Evaluating the data with the testing device formed on the substrate is particularly advantageous if the results of the redundancy analysis can be stored in a non-volatile memory formed on the substrate. In contrast to the previous testing methods, using the approach according to the invention with a testing device that is formed on the substrate, it is only necessary to make contact with an external device, for example, in the form of a tester, once at the beginning and once at the end of the testing. Contact can be made at the beginning of testing, if appropriate, to store the test program in the memory modules, and contact can be made at the end of testing, if appropriate, to transfer the acquired data. A test can take a relatively long time, and just one operating voltage supply is necessary during the testing. Thus, such a test can be carried out without contact with the external device.

If the test program and/or the results are stored in the memory that will be tested, copying operations may be necessary during the testing to transfer the information that had been stored before testing from untested memory cell locations into already-tested memory cell locations.

The results of a redundancy analysis performed by the external device or by the testing device are finally used to assign the redundant memory cells irreversibly to the defective memory cells.

We claim:

1. A testing device in combination with a substrate having a memory to be tested, wherein:
   the memory including a plurality of memory cells formed in a memory cell array;
   the memory storing a test program;
   the memory being formed at the substrate; and
   said testing device including an interpreter element operating and testing the memory in accordance with the test program stored in said memory cell array.

2. The testing device according to claim 1, wherein said interpreter element is formed at the substrate.

3. The test device according to claim 1, wherein the substrate has a plurality of memories each formed at the substrate, and the plurality of the memories to be separated after testing is concluded.

4. The testing device according to claim 3, comprising:
   a plurality of separate testing apparatuses each formed at the substrate;
   each one of said plurality of said testing apparatuses being associated with a respective one of the plurality of the memories.

5. The testing device according to claim 3, wherein said interpreter element is associated with each one of the plurality of the memories.

6. The testing device according to claim 5, wherein said interpreter element is formed at the substrate.

7. The testing device according to claim 1, wherein:

the test program includes an individual test instruction;

said interpreter element has a control part that writes a specific test data pattern to at least one of the memory cells of the memory in accordance with the test instruction; and said interpreter element makes the test data pattern available as expected data.

8. The testing device according to claim 1, wherein:

said testing device includes a test instruction reading device that reads individual test instructions out of the test program that is stored in said memory cell array; and said test instruction reading device has an output providing the individual test instructions.

9. The testing device according to claim 8, wherein said testing device includes a register for buffering the individual test instructions that are output by said test instruction reading device.

10. The testing device according to claim 8, wherein said testing device includes a plurality of registers for buffering a plurality of the individual test instructions.

11. The testing device according to claim 10, wherein said testing device includes a control part that fetches the individual test instructions from said plurality of said registers in succession.

12. The testing device according to claim 1, wherein:

said testing device includes a comparator device for comparing expected data with data that is read out of the plurality of the memory cells of the memory; and said comparator device supplies a result when the data that is read out does not equal the expected data.

13. The testing device according to claim 12, wherein the result supplied by said comparator device is an address of a faulty one of the plurality of the memory cells.

14. The testing device according to claim 12, wherein said testing device includes a result register that buffers the result supplied by said comparator device.

15. The testing device according to claim 12, wherein:

said comparator device supplies a plurality of results; and said testing device includes a plurality of registers that successively store the results supplied by said comparator circuit.

16. The testing device according to claim 12, in combination with a results memory, wherein said testing device includes a writing device that writes the result from said comparator device into said results memory.

17. The testing device according to claim 16, wherein said results memory is formed at the substrate.

18. The testing device according to claim 16, wherein said results memory is formed by at least some of the plurality of the memory cells of the memory.

19. The testing device according to claim 18, wherein:

said writing device redundantly writes the result from said comparator device into said results memory; and said results memory is formed by at least some of the memory cells of the memory.

20. The testing device according to claim 1, wherein:

said testing device includes a test instruction reading device that redundantly reads individual test instructions out of the test program that is stored in the memory; and said test instruction reading device has an output providing the individual test instructions.

* * * * *